United States Patent
Kim et al.

(10) Patent No.: US 11,721,408 B2
(45) Date of Patent: Aug. 8, 2023

(54) MEMORY DEVICE CAPABLE OF OUTPUTTING FAIL DATA IN PARALLEL BIT TEST AND MEMORY SYSTEM INCLUDING THE MEMORY DEVICE

(71) Applicant: SAMSUNG ELECTRONICS CO., LTD., Suwon-si (KR)

(72) Inventors: Daejeong Kim, Seoul (KR); Namhyung Kim, Seoul (KR); Dohan Kim, Hwaseong-si (KR); Deokho Seo, Suwon-si (KR); Wonjae Shin, Seoul (KR); Insu Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 68 days.

(21) Appl. No.: 17/388,238

(22) Filed: Jul. 29, 2021

(65) Prior Publication Data

US 2022/0139485 A1  May 5, 2022

(30) Foreign Application Priority Data

Nov. 4, 2020 (KR) .......................... 10-2020-0146316

(51) Int. Cl.
*G01R 31/28* (2006.01)
*G11C 29/42* (2006.01)
*G11C 29/50* (2006.01)
*G06F 11/10* (2006.01)

(52) U.S. Cl.
CPC .......... *G11C 29/42* (2013.01); *G06F 11/1068* (2013.01); *G11C 29/50004* (2013.01); *G11C 2029/5004* (2013.01)

(58) Field of Classification Search
CPC ............ G06F 11/1012; G06F 11/1044; G06F 11/1068; G06F 9/30029; G06F 11/4063; G06F 11/4078; G06F 2029/2602; G06F 2029/5004; G06F 29/14; G06F 29/26; G06F 29/42; G06F 29/50004
See application file for complete search history.

(56) References Cited

U.S. PATENT DOCUMENTS 6,909,650 B2 *  6/2005  Ryu ................... G11C 29/1201
                                                      365/201
7,936,594 B2    5/2011  Park et al.
(Continued)

FOREIGN PATENT DOCUMENTS

KR    10-0185635    12/1998
KR    10-0464436    12/2004
(Continued)

*Primary Examiner* — Albert Decady
*Assistant Examiner* — Enamul M Kabir
(74) *Attorney, Agent, or Firm* — F. Chau & Associates, LLC

(57) ABSTRACT

A memory device includes a memory cell array and a test controller. The memory cell array includes a plurality of memory cells, where the memory cell array is divided into multiple regions. The test controller is configured to perform a parallel bit test (PBT) on the plurality of memory cells, where the test controller selects fail data including a fail data bit among internal data output from the multiple regions during the PBT, and outputs the fail data via a data input/output signal line to the outside of the memory device.

20 Claims, 11 Drawing Sheets

(56) References Cited

U.S. PATENT DOCUMENTS

| | | | | |
|---|---|---|---|---|
| 7,941,714 B2* | 5/2011 | Cho | ................... | G11C 29/1201 |
| | | | | 365/201 |
| 8,537,628 B2* | 9/2013 | Kim | ....................... | G11C 29/46 |
| | | | | 365/233.5 |
| 9,508,452 B2 | 11/2016 | Ryu et al. | | |
| 2004/0252549 A1* | 12/2004 | Kim | ....................... | G11C 29/48 |
| | | | | 365/154 |
| 2007/0283198 A1* | 12/2007 | Lee | ....................... | G11C 29/44 |
| | | | | 714/724 |
| 2007/0288812 A1* | 12/2007 | Byun | ..................... | G11C 29/40 |
| | | | | 714/720 |
| 2008/0022170 A1* | 1/2008 | Byun | ..................... | G11C 29/34 |
| | | | | 714/724 |
| 2008/0082870 A1* | 4/2008 | Park | ................... | G06F 11/1008 |
| | | | | 714/704 |
| 2008/0168316 A1* | 7/2008 | Cho | ....................... | G11C 29/26 |
| | | | | 714/E11.002 |
| 2009/0228747 A1* | 9/2009 | Kim | ....................... | G11C 29/26 |
| | | | | 714/704 |
| 2013/0235677 A1* | 9/2013 | Park | ....................... | G11C 29/04 |
| | | | | 365/189.07 |
| 2015/0206573 A1* | 7/2015 | Ryu | ....................... | G11C 29/26 |
| | | | | 365/191 |
| 2017/0110206 A1* | 4/2017 | Ryu | ....................... | G11C 29/4401 |
| 2018/0025788 A1* | 1/2018 | Kim | ....................... | G06F 3/0656 |
| | | | | 365/189.05 |
| 2019/0027230 A1* | 1/2019 | Ryu | ....................... | G06F 11/1048 |
| 2021/0313001 A1* | 10/2021 | Jang | ....................... | G11C 29/38 |

FOREIGN PATENT DOCUMENTS

| | | | | |
|---|---|---|---|---|
| KR | 10-0524925 | 10/2005 | | |
| KR | 10-2007-0066185 | 6/2007 | | |
| KR | 10-2008-0003501 | 1/2008 | | |
| KR | 20080007806 A | * 1/2008 | ............ | G11C 29/42 |
| KR | 10-0905712 | 6/2009 | | |
| KR | 10-2009-0117189 | 11/2009 | | |
| KR | 10-2012-0003675 | 1/2012 | | |
| KR | 10-2015-0088018 | 7/2015 | | |

* cited by examiner

| IDQ[3:0] | | | | S1 | S2 | FDO[3:0] | | | |
|---|---|---|---|---|---|---|---|---|---|
| IDQ3 | IDQ2 | IDQ1 | IDQ0 | | | FDO3 | FDO2 | FDO1 | FDO0 |
| I0 | I1 | I3 | I2 | | | | | | |
| 1 | 1 | 1 | 0 | 1 | 0 | 1 | 1 | 1 | 0 |
| 1 | 1 | 0 | 1 | 1 | 1 | 1 | 1 | 0 | 1 |
| 1 | 0 | 1 | 1 | 0 | 1 | 1 | 0 | 1 | 1 |
| 0 | 1 | 1 | 1 | 0 | 0 | 0 | 1 | 1 | 1 |

: Fail data

FIG. 6B

MEMORY DEVICE CAPABLE OF OUTPUTTING FAIL DATA IN PARALLEL BIT TEST AND MEMORY SYSTEM INCLUDING THE MEMORY DEVICE

CROSS-REFERENCE TO RELATED APPLICATION

This application claims priority under 35 U.S.C. § 119 to Korean Patent Application No. 10-2020-0146316, filed on Nov. 4, 2020 in the Korean Intellectual Property Office, the disclosure of which is incorporated by reference herein in its entirety.

TECHNICAL FIELD

Embodiments of the inventive concept relate to a semiconductor memory device, and more particularly, to a memory device capable of outputting fail data in a parallel bit test (PBT) mode to support an error correction code (ECC) function, and a memory system including the memory device.

DISCUSSION OF RELATED ART

Data processing systems such as data centers are hosted by many enterprises and their computer systems. The data center is used to distribute hosted applications and/or transactions, and includes networked computer resources, commonly referred to as the cloud, such as servers, disks, or virtual machines. In this configuration, the enterprises are clients of the data center. The data center provides the clients with many benefits including reduced cost, easy expandability, and reduced administrative burden.

In the data center, the demand for a memory having a high capacity has increased for stable and fast real-time processing of large amount of data. However, the performance quality of the memory may change over time. For example, at a time point when applications and/or transactions are allocated and memory is used in the data center, a fault may occur due to a failed memory. When this fault occurs frequently, availability constraints in the use of the data center may follow, such as disrupting a normal flow of command execution, aborting and restarting an operation in process, or the like.

The data center widely uses dynamic random access memory (DRAM) as an operating memory or a main memory of a system thereof, to store data or instructions used by a host in the data center and/or to perform computational operations. In general DRAM, data is written or written data is read according to control of the host. When a computer operation is performed, the host retrieves instructions and/or data from the DRAM, executes instructions, and/or uses the data to perform a computer operation. When there is a result of the computer operation, the host writes back the result of the computer operation to the DRAM.

When the DRAM is malfunctioning while these operations are performed, fail data may occur. Operation errors of the DRAM may occur due to various causes, but a failed DRAM cell may be the main cause. In a process of manufacturing the DRAM, pass/fail of the DRAM is tested by using a wafer level test, a package level test, a mounting test, etc. DRAM that has passed the tests may be mounted, for example, on a memory module. The memory module may support an ECC function of detecting and correcting an error bit.

As the capacity of DRAM increases, the PBT that is built in the DRAM may be performed to reduce the test time. The PBT uses an eXclusive OR (XOR) or eXclusive NOR (XNOR) logic circuit. The PBT writes the same data to a plurality of memory cells, performs a comparison operation via the XOR or XNOR logic circuit, and performs tests where a pass is determined when data in the same logic state is read from the plurality of memory cells, and a fail is determined when at least one data in a different logic state is read.

However, when the fail is determined according to the PBT, e.g., when the fail occurs as a result of the comparison operation, a memory cell of an error bit that has caused the fail may not be specified by using the output of the PBT. In this case, despite the ECC function of the memory module, there is an issue where the error bit may not be detected and corrected. Accordingly, the DRAM mounted on the memory module needs to specify and output the fail data in the PBT. In addition, when only the fail data is output by the PBT, and when this facility is feasible, because the ECC function of the memory module can be performed, a fail location of the memory module may be accurately identified.

SUMMARY

A memory device according to an embodiment of the inventive concept includes a memory cell array including a plurality of memory cells, where the memory cell array is divided into multiple regions, and a test controller configured to perform a parallel bit test (PBT) on the plurality of memory cells, where the test controller selects fail data including a fail data bit among internal data output from the multiple regions during the PBT, and outputs the fail data via a data input/output signal line to the outside of the memory device.

A memory system according to an embodiment of the inventive concept includes a plurality of memory devices coupled to a printed circuit board, and each including a memory cell array including a plurality of memory cells and a test controller, where the memory cell array is divided into multiple regions, and a memory controller configured to control the plurality of memory devices, and including an error correction code (ECC) engine configured to correct and detect an error of data read from the plurality of memory devices. In each of the plurality of memory devices, the test controller performs a parallel bit test (PBT) on the multiple regions of the memory cell array, selects fail data including a fail data bit among internal data output from the multiple regions during the PBT, and outputs the fail data to the memory controller via a data input/output signal line. The memory controller corrects the fail data bit of the fail data by using the ECC engine.

According to an embodiment of the inventive concept, in an operating method of a memory system including a memory device and a memory controller, where the memory device includes a memory cell array and the memory controller includes an error correction code (ECC) engine configured to correct and detect an error of data read from the memory device, the operating method includes dividing, in the memory device, a plurality of memory cells of the memory cell array into multiple regions, performing, in the memory device, a parallel bit test (PBT) for the multiple regions, selecting, in the memory device, fail data including a fail data bit among internal data output from the multiple regions during the PBT, outputting, by the memory device, the fail data including the fail data bit to the memory controller via a data input/output signal line, and correcting, in the memory controller, the fail data bit of the fail data by using the ECC engine.

A memory device according to an embodiment of the inventive concept includes a memory cell array and a test controller. The memory cell array includes a plurality of memory cells, where the memory cell array is divided into multiple regions. The test controller is configured to perform a parallel bit test (PBT) on the plurality of memory cells for each of the multiple regions, and to generate a first select signal and a second select signal based on internal data output from each of the multiple regions during the PBT, select fail data comprising a fail data bit among the internal data in response to the first and second select signals, load the fail data on a data input/output signal line, and output the loaded fail data to the outside of the memory device.

According to an embodiment of the inventive concept, in an operating method of a system including a host device, a memory controller, and a memory device, the operating method includes transmitting, by the host device, a read request to the memory controller, issuing, by the memory controller, a read command to the memory device in response to the read request, performing, by the memory device, a read operation in response to the read command, and transmitting read data to the host device, detecting, by the host device, that the read data includes first fail data, and transmitting first fail information about the first fail data to the memory controller, issuing, by the memory controller, a test command to the memory device to detect a fail memory cell, and performing, by the memory device, a parallel bit test (PBT) operation on a memory cell array of the memory device.

BRIEF DESCRIPTION OF THE DRAWINGS

The above and other features of the inventive concept will be more clearly understood by describing in detail embodiments thereof with reference to the accompanying drawings.

FIGS. 6A and 6B are a diagram and a table, respectively, describing a PBT circuit, according to an embodiment of the inventive concept.

DETAILED DESCRIPTION OF THE EMBODIMENTS

Figure 1:
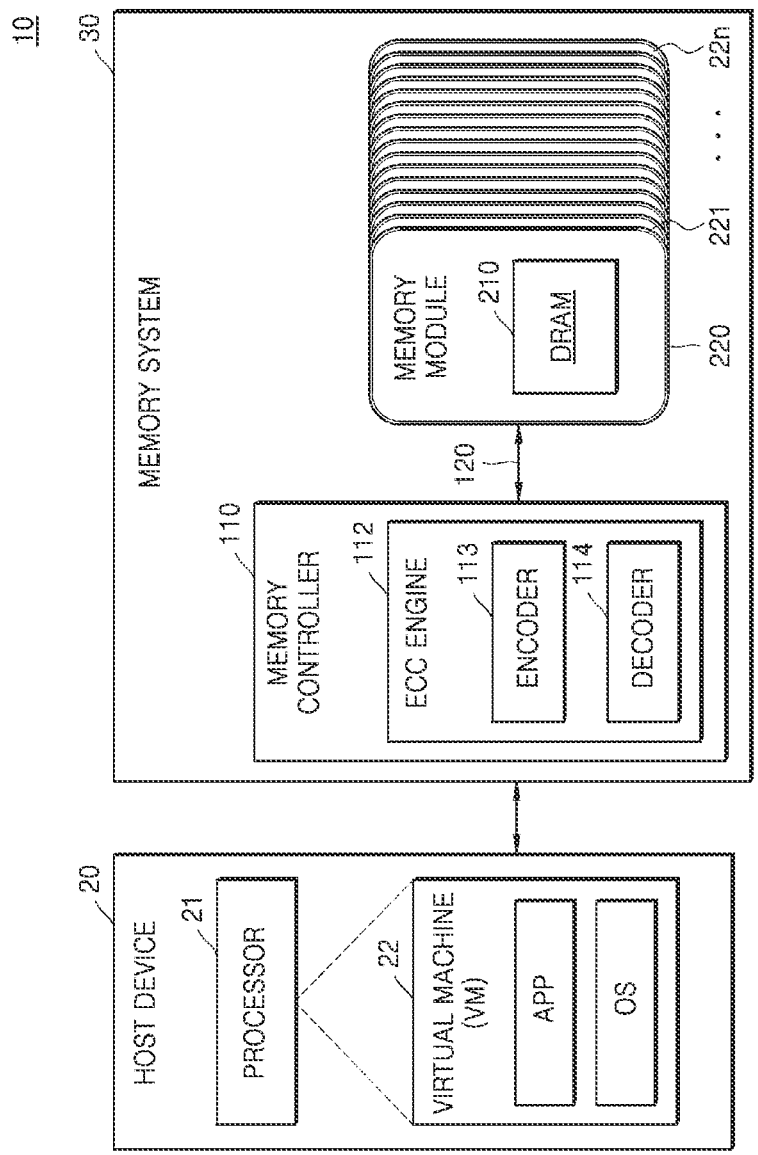
FIG. 1 is a schematic block diagram of a system according to an embodiment of the inventive concept.

Embodiments of the inventive concept provide a memory device capable of outputting fail data in a parallel bit test (PBT) mode and a memory system including the memory device.

Embodiments of the inventive concept will be described more fully hereinafter with reference to the accompanying drawings. Like reference numerals may refer to like elements throughout this application.

FIG. 1 is a schematic block diagram of a system according to an embodiment of the inventive concept.

Referring to FIG. 1, a system 10 may include a data center including dozens of host machines or servers running hundreds of virtual machines. According to embodiments of the inventive concept, the system 10 may include, as an example, a computing device such as a laptop computer, a desktop computer, a server computer, a work station, a portable communication terminal, a personal digital assistant (PDA), a portable multimedia player (PMP), a smartphone, a tablet PC, or other suitable computers, a virtual machine, or a virtual computing device thereof. Alternatively, the system 10 may include some components included in a computing system such as a graphics card.

The system 10 is illustrated with a plurality of hardware configurations to be described below in more detail with reference to FIG. 1, but is not limited thereto, and other configurations may be possible. The system 10 may include a host device 20 and a memory system 30. The host device 20 and the memory system 30 may communicate with each other by using various protocols, for example, peripheral component interconnect-express (PCI-E), advanced technology attachment (ATA), serial ATA (SATA), parallel ATA (PATA), or serial attached small computer serial interface (SCSI) (SAS). In addition, various other interface protocols, such as a universal serial bus (USB), a multi-media card (MMC), enhanced small disk interface (ESDI), or integrated drive electronics (IDE), may be used as a protocol between the host device 20 and the memory system 30.

The host device 20 may include a processor 21 and a virtual machine (VM) 22. The processor 21 may be connected to and communicate with the memory system 30. The memory system 30 connected to the processor 21 may be referred to as a system memory.

Some examples may be described by the expressions 'connected' and/or 'coupled' along with their derivatives. These terms may not be necessarily intended as synonyms of each other. For example, descriptions using the terms 'connected' and/or 'coupled' may indicate that two or more elements are in direct physical or electrical contact with each other. In addition, the term 'connected' and/or 'combined' may also indicate that two or more elements are not in direct contact with each other but still cooperate or interact with each other.

The processor 21 may be a functional block that performs general computer operations in the system 10, and may include a central processing unit (CPU), a digital signal processor (DSP), a network processor, an application processor (AP), or a processor of any type like another device for executing code.

The processor 21 may be configured to execute one or more machine-executable instructions or pieces of software, firmware, or a combination thereof. The processor 21 may include any number of processor cores. For example, the processor 21 may include a single-core or a multi-core such as a dual-core, a quad-core, or a hexa-core. Although the system 10 including one processor 21 is illustrated in FIG. 1, according to embodiments of the inventive concept, the system 10 may include a plurality of processors.

The processor 21 may execute software in a virtualized environment. In the host device 20, the VM 22 may include an application APP and an operating system OS. Because the VM 22 may change dynamically during its usage of being started and stopped by a user, the number of VMs 22 that may be executed by the processor 21 may vary.

Software entities, such as an operating system OS, may potentially view the processor 21 as a logical processor or processing element capable of concurrently executing the VM 22. For example, n (where n is a natural number) operating systems OS may regard the processor 21 as n logical processors or processing elements. Because the application APP uses a virtual address space, a virtual address, e.g., an address that may be used by software, may be used. The operating system OS in each VM 22 may control which application APP accesses a memory device 210 at a certain time, and may at least, to a degree, control addresses that are accessed by the application APP. The operating system OS in the VM 22 may perform and manage a mapping of the virtual address (VA) to a physical address (PA) in the VM 22. The PA generated by the operating system OS may be a system PA of a PA space over the memory device 210 of the memory system 30 (e.g., an address that may be used by a memory controller 110). The operating system OS may perform address translation (for example, address mapping) between the VA and the system PA.

In FIG. 1, one VM 22 is illustrated to briefly illustrate machine virtualization in the system 10, and each of the VMs 22 may include one or more applications APP and an operating system OS. According to an embodiment of the inventive concept, a plurality of VMs may be executed, and the processor 21 may execute and implement many applications APP and/or transactions in time and memory footprint by using a combination of hardware acceleration using hardware and software.

The memory system 30 may include a memory controller 110, a plurality of memory modules 220 through 22n, and a memory interface 120. The memory controller 110 may, by responding to a request from the host device 20 connected to the memory system 30, control a memory access operation (for example, a write operation or a read operation) and/or an error correction code (ECC) operation for the plurality of memory modules 220 through 22n. The plurality of memory modules 220 through 22n may be used as working memories for recording or loading data used for the operation of the processor 21.

The memory interface 120 is illustrated as being connected to one signal line between the memory controller 110 and the plurality of memory modules 220 through 22n for the sake of simplicity, but in reality, may be connected via a plurality of signal lines. The memory interface 120 may include connectors for connecting the memory controller 110 to the plurality of memory modules 220 through 22n, and the connectors may be implemented as pins, balls, signal lines, or other hardware components. For example, a clock signal CLK, a command/address signal C/A, data DQ, or the like may be transmitted between the memory controller 110 and the plurality of memory modules 220 through 22n via the memory interface 120. The memory interface 120 may be implemented as a single channel including a plurality of signal lines, or may be implemented as a plurality of channels. In addition, one or more memory modules may be connected to each channel. The memory interface 120 may be referred to as a channel, and in the following embodiments of the inventive concept, the terms "the memory interface" and "the channel" may be used interchangeably.

The memory controller 110 may access the plurality of memory modules 220 through 22n according to a memory request from the processor 21, and the system PA may be provided for a memory access. The memory controller 110 may include a memory physical layer interface, e.g., a memory PHY, for memory interfacing such as selecting a row and column corresponding to a memory cell, writing data to the memory cell, or reading written data. Actual physical implementation of the memory controller 110 that performs the functions illustrated above may vary. For example, the memory controller 110 may include one or more hardware components (for example, analog circuits and logic circuits). The memory controller 110 may be implemented as program code of software and/or firmware. The memory controller 110 may be commonly integrated with the processor(s) 21 to consistently access the plurality of memory modules 220 through 22n by the processor(s) 21.

Each of the plurality of memory modules 220 through 22n may include, for example, the memory device 210 including dynamic random access memory (DRAM). In an embodiment of the inventive concept, one memory device 210 in the memory module 220 is described, but the inventive concept is not limited thereto, and the memory module 220 may include a variety of memory devices. Additionally, the memory module 220 may include different memory devices. For example, the plurality of memory modules 220 through 22n may be implemented as an un-buffered dual in-line memory module (DIMM) (UDIMM), a registered DIMM (RDIMM), a load reduced DIMM (LRDIMM), a fully buffered DIMM (FBDIMM), a small outline DIMM (SODIMM), or the like.

The memory controller 110 may include an ECC engine 112 to detect and correct errors in written data input by the host device 20 or read data output by the plurality of memory modules 220 through 22n, and transmit corrected data. The ECC engine 112 may be referred to as an ECC circuit block.

The ECC engine 112 may include an encoder 113 and a decoder 114. The encoder 113 may generate parity bits by encoding write data to be written to a target memory module among the plurality of memory modules 220 through 22n, input by the host device 20. The write data and parity bits may be stored in the memory device 210 of the target memory module. The decoder 114 may correct error bit data by using the read data and parity bits output by the memory device 210 of the target memory module among the plurality of memory modules 220 through 22n, and may output the corrected error bit data to the host device 20.

The ECC engine 112 may use, for example, parity bits of 8 bits for data of 64 bits. 64 bits of data and 8 bits of the parity bits may be combined and referred to as a codeword. One codeword may include 72 bits, and a [72, 64] Hamming code may be used for one codeword during the ECC operation.

Figure 2:
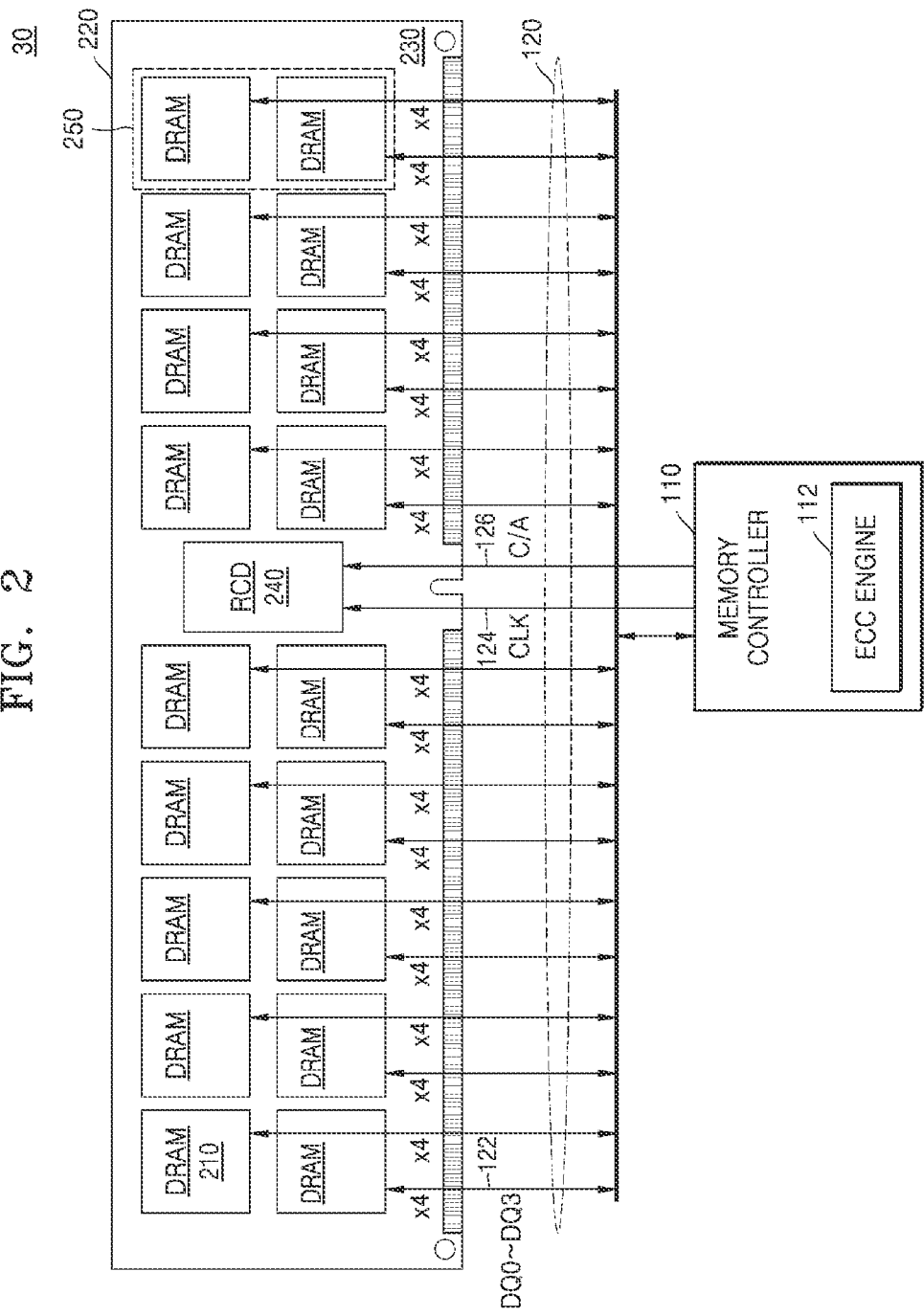
FIG. 2 is a block diagram of a memory module in FIG. 1 according to an embodiment of the inventive concept.

FIG. 2 is a block diagram of a memory module in FIG. 1 according to an embodiment of the inventive concept. Hereinafter, for convenience of description, the memory module 220 will be described as a representative example of the plurality of memory modules 220 through 22n in the memory system 30.

Referring to FIG. 2, the memory module 220 of the memory system 30 may be implemented with an RDIMM, and thus may be referred to as the RDIMM 220. The memory module 220 may be connected to the memory controller 110 via the memory interface 120. The memory interface or channel 120 may include data buses 122, a clock signal CLK line 124, command/address signal C/A lines 126, etc.

The memory module 220 may include a plurality of memory devices 210 and a register clock driver (RCD) 240 coupled to a printed circuit board 230. For example, the memory devices 210 may include DRAM devices. The memory device 210 may be referred to as DRAM, and in the following embodiments of the inventive concept, the terms "the memory device" and "the DRAM" may be used interchangeably. However, the inventive concept is not limited thereto, and the memory device 210 may include any one of volatile memory devices such as synchronous DRAM (SDRAM), double data rate (DDR) SDRAM (DDR SDRAM), low power (LP) DDR SDRAM (LPDDR SDRAM), graphics (G) DDR SDRAM (GDDR SDRAM), DDR2 SDRAM, DDR3 SDRAM, DDR4 SDRAM, DDR5 SDRAM, wide input/output (I/O) DRAM, high bandwidth memory (HBM), or hybrid memory cube (HMC).

According to embodiments of the inventive concept, the memory devices 210 may be configured with non-volatile memory devices. Non-volatile memory devices may include, as non-limiting examples, a flash memory, phase change RAM (PRAM), resistance RAM (RRAM), magnetic RAM (MRAM), ferroelectric RAM (FRAM), electrically erasable programmable read-only memory (ROM) (EEPROM), nano floating gate memory (NFGM), or polymer RAM (PoRAM).

According to an embodiment of the inventive concept, the memory devices 210 may be configured with heterogeneous memory devices including non-volatile memory devices and volatile memory devices.

The clock signal CLK line 124 and the command/address signal C/A lines 126 may be provided from the memory controller 110 to the RCD 240. The RCD 240 may provide the clock signal CLK received via the clock signal CLK line 124 to each of the memory devices 210, and provide control/command/address signals received via the command/address signal C/A line 126 to each of the memory devices 210. The RCD 240 may be connected to the memory devices 210 in a fly-by method or topology, and a module termination resistor may be connected to the command/address signal C/A line 126. Bi-directional data buses 122 via which the data DQ is transmitted may be coupled to one another between each of the memory devices 210 and the memory controller 110. The data buses 122 may be referred to as a data input/output signal line.

The memory module 220 may be configured with, for example, one rank configured with 64 data bits. For the one rank configuration, the memory module 220 may include 16 of 4-bit DRAMs 210. In addition, the memory module 220 may further include two of 4-bit DRAMs 250 that store parity bits of 8 bits to implement the ECC function for 64 data bits.

The memory controller 110 may receive 64 data bits from the processor 21, divide the received 64 data bits into units of 4 bits, generate parity bits of 8 bits for the divided 64 data bits, and write the divided 64 data bits and the generated parity bits of 8 bits to the memory devices 210 via the data buses 122. In addition, the memory controller 110 may receive 64 data bits and 8 parity bits that are read from the memory devices 210 via the data buses 122, correct error bit data, and transmit the corrected error bit data to the processor 21.

Figure 3:
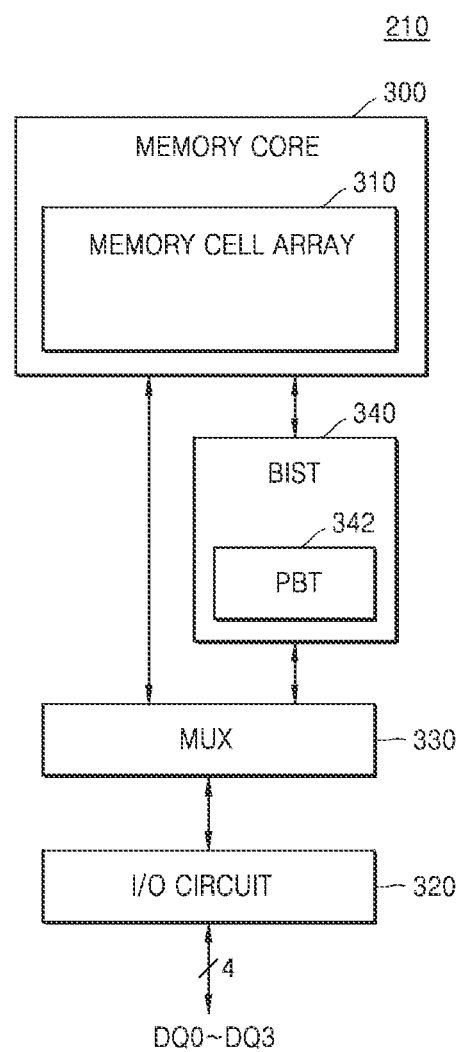
FIG. 3 is a block diagram of a memory device according to an embodiment of the inventive concept.

FIG. 3 is a block diagram of a memory device according to an embodiment of the inventive concept. FIG. 3 illustrates a number of hardware components included in the memory device 210, but the inventive concept is not limited thereto, and other configurations may be possible.

Referring to FIGS. 2 and 3, the memory device 210 may be configured with, for example, DRAMs, and the DRAM may mainly include a memory core 300 and a peripheral circuit. The memory core 300 may include a memory cell array 310, a row decoder, a column decoder, and a sense amplifier. The memory cell array 310 may include a plurality of word lines and a plurality of bit lines, and a plurality of memory cells formed at points where the word lines intersect with the bit lines. The row decoder may enable a word line corresponding to a row address, the sense amplifier may sense and amplify data of memory cells connected to the enabled word line and transmit the amplified data of the memory cells to the bit lines, and the column decoder may, in a burst mode, gradually increase the received column address, and select the bit lines corresponding to the gradually increased column address.

The peripheral circuit may include an input/output (I/O) circuit unit 320, a multiplexer 330, and a test controller 340. The I/O circuit unit 320 may include address buffers for buffering address signals input via I/O pads, data input buffers, data output buffers, and a control logic for decoding control signals, etc. The I/O circuit unit 320 may be connected to the data buses 122 (as shown in FIG. 2) via which first through fourth data DQ0 through DQ3 of 4 bits are transmitted or received.

The multiplexer 330 may multiplex address signals, data DQ signals, and control signals in response to a normal mode or a test mode. In the normal mode, the multiplexer 330 may connect the address signals, data DQ signals, and control signals to the memory core 300, and allow a normal operation to be performed. In the test mode, the multiplexer 330 may connect the address signals, data DQ signals, and control signals to the test controller 340, and allow a built-in self-test (BIST) operation to be performed.

The test controller 340 may be implemented as a BIST circuit. The test controller 340 may be referred to as a BIST circuit, and in the following embodiments of the inventive concept, the terms "the test controller" and "the BIST circuit" may be used interchangeably. The BIST circuit 340 may perform a memory full cell test on the memory core 300 in the test mode. As a result of the test, the BIST circuit 340 may store address information about a fail cell exhibiting fail characteristics in the memory core 300.

The BIST circuit 340 may include a parallel bit test (PBT) circuit 342. In the test mode, the PBT circuit 342 may identify and output only fail data from data that is read in parallel from a plurality of memory regions in the memory cell array 310 of the memory core 300. The identified fail data output by the PBT circuit 342 may be provided to the memory controller 110 via the multiplexer 330 and the I/O circuit unit 320 together with address information about the fail cell. The memory controller 110 may correct the fail data corresponding to the address information about the fail cell received from the memory device 210, by using the ECC engine 112.

Figure 4:
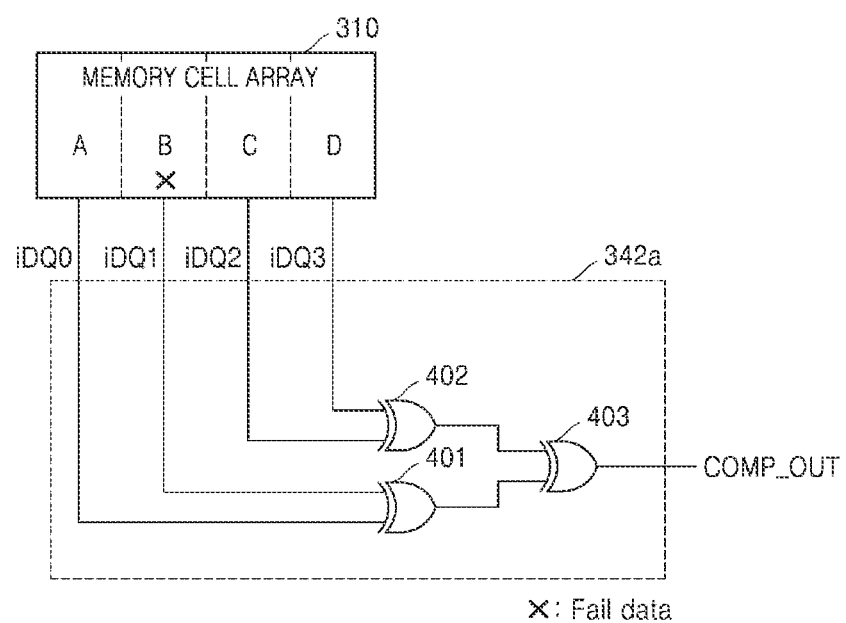
FIG. 4 is a general parallel bit test (PBT) circuit diagram described as a comparative example for a PBT circuit, according to an embodiment of the inventive concept.

FIG. 4 is a general PBT circuit diagram described as a comparative example for a PBT circuit, according to an embodiment of the inventive concept. Hereinafter, subscripts attached to reference numbers (for example, "a" of 342a and "a" of 220a) are used to distinguish a plurality of circuits having the same function.

Referring to FIG. 4, a PBT circuit 342a may write the same data to a plurality of memory cells of the memory cell array 310 before performing the PBT. In the PBT mode, the PBT circuit 342a may finally output a comparison signal COMP_OUT by comparing first through fourth internal data iDQ0 through iDQ3 read from the memory cell array 310 with each other step by step as a pair of bits. In the normal mode, the first through fourth internal data iDQ0 through iDQ3 of 4 bits read from the memory cell array 310 may be the same as the first through fourth data DQ0 through DQ3 that are loaded on the data buses 122 and respectively output. For convenience of description, the first through fourth internal data iDQ0 through iDQ3 of 4 bits read from the memory cell array 310 may be output as the first through fourth data DQ0 through DQ3, respectively, and it is assumed that the first through fourth internal data iDQ0 through iDQ3 (iDQ[3:0]) are output from first through fourth regions A, B, C, and D of the memory cell array 310, respectively. Each of the first through fourth regions A, B, C, and D may be referred to as a memory bank or a sub-region within the memory bank. According to an embodiment of the inventive concept, internal data output from each of the first through fourth regions A, B, C, and D may include various bits, for example, X4, X8, and X16 bits.

The PBT circuit 342a may include a first XOR logic circuit 401 for inputting or receiving the first and second internal data iDQ0 and iDQ1, a second XOR logic circuit 402 for inputting or receiving the third and fourth internal data iDQ2 and iDQ3, and a third XOR logic circuit 403 for inputting or receiving an output of the first XOR logic circuit 401 and an output of the second XOR logic circuit 402. An output of the third XOR logic circuit 403 may be output as the comparison signal COMP_OUT.

The PBT circuit 342a may output the comparison signal COMP_OUT having a logic low level when the first through fourth internal data iDQ0 through iDQ3 (iDQ[3:0]), respectively output by the first through fourth regions A, B, C, and D of the memory cell array 310, are output in an identical logic state. The PBT circuit 342a may output the comparison signal COMP_OUT having a logic high level when any one of the first through fourth internal data iDQ0 through iDQ3 is in a different logic state.

For example, when the second internal data iDQ1 of the first through fourth internal data iDQ0 through iDQ3, or iDQ[3:0], read in the second region B is fail data output in a different logic state, the comparison signal COMP_OUT of the PBT circuit 342a may be output at a logic high level. However, the comparison signal COMP_OUT at a logic high level may not specify that the second internal data iDQ1 is fail data, but may indicate only that there is fail data among the first through fourth internal data iDQ0 through iDQ3. The comparison signal COMP_OUT at a logic high level output by the PBT circuit 342a may be provided to the memory controller 110 via the multiplexer 330 and the I/O circuit unit 320. In this case, the memory controller 110 may support the ECC function, but may not correct the fail data in the second region B.

Figure 5A:
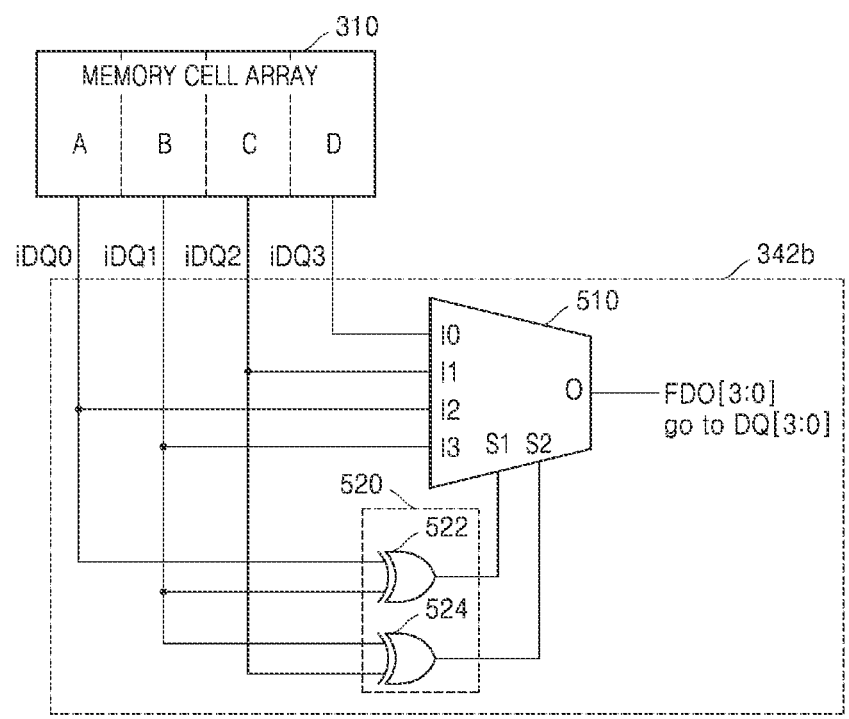
FIGS. 5A and 5B are a diagram and a table, respectively, describing a PBT circuit, according to an embodiment of the inventive concept.
Figure 5B:

FIGS. 5A and 5B are a diagram and a table, respectively, describing a PBT circuit, according to an embodiment of the inventive concept. FIG. 5A illustrates a circuit diagram of a PBT circuit 342b, and FIG. 5B illustrates a table describing an operation of the PBT circuit 342b.

Referring to FIG. 5A, the first through fourth internal data iDQ0 through iDQ3, or iDQ[3:0], may be output from each of the first through fourth regions A, B, C, and D of the memory cell array 310. The first through fourth internal data iDQ[3:0] of a region selected among the first through fourth regions A, B, C, and D may be provided to the PBT circuit 342b. The PBT circuit 342b may include a first selector 510 and a first select signal generator 520. In an embodiment of the inventive concept, the first selector 510 and the first select signal generator 520 may be circuits.

The first selector 510 may be implemented as a multiplexer having first through fourth inputs I0 through I3, first and second select signals S1 and S2 inputs, and an output O. In the PBT mode, the first through fourth internal data iDQ[3:0] output from a region selected among the first through fourth memory regions A, B, C, and D of the memory cell array 310 may be provided to the first through fourth inputs I0 through I3 of the first selector 510, respectively. A fourth internal data iDQ3 line may be connected to the first input I0 of the first selector 510, a third internal data iDQ2 line may be connected to the second input I1, a first internal data iDQ0 line may be connected to the third input I2, and a second internal data iDQ1 line may be connected to the fourth input I3. In other words, the first through fourth internal data lines may transmit the first through fourth internal data iDQ0 through iDQ3. Additionally, first and second select signal lines may transmit the first and second select signals S1 and S2.

The first select signal generator 520 may include a first XOR logic circuit 522 for outputting the first select signal S1 and a second XOR logic circuit 524 for outputting the second select signal S2. The first XOR logic circuit 522 may have a first input for receiving the first internal data iDQ0, a second input for receiving the second internal data iDQ1, and an output for outputting the first select signal S1. The first select signal S1 may be provided to the first select signal S1 input of the first selector 510. The second XOR logic circuit 524 may include a first input for receiving the second internal data iDQ1, a second input for receiving the third internal data iDQ2, and an output for outputting the second select signal S2. The second select signal S2 may be provided to the second select signal S2 input of the first selector 510.

The first selector 510 may select the first through fourth inputs I0 through I3 in response to the first and second select signals S1 and S2, and output the selected inputs as first through fourth output data FDO[3:0], respectively. The first through fourth output data FDO[3:0] may be output as the first through fourth data DQ (DQ0 through DQ3 in FIG. 3), respectively, and may be provided to the memory controller (110 in FIG. 2).

For example, when first and second select signal bits [S1:S2] are "00", the first selector 510 may output the first through fourth internal data iDQ0 through iDQ3, including the fourth internal data iDQ3 of the first input I0, as the first through fourth output data FDO[3:0], respectively. In this case, the fourth internal data iDQ3 may be specified as a fail data bit output in a different logic state from those of the first through third internal data iDQ0 through iDQ2.

When the first and second select signal bits [S1:S2] are "01", the first selector 510 may output the first through fourth internal data iDQ0 through iDQ3, including the third internal data iDQ2 of the second input I1, as the first through fourth output data FDO[3:0], respectively. In this case, the third internal data iDQ2 may be specified as a fail data bit output in a different logic state from those of the first, second, and fourth internal data iDQ0, iDQ1, and iDQ3.

When the first and second select signal bits [S1:S2] are "10", the first selector 510 may output the first through fourth internal data iDQ0 through iDQ3, including the first internal data iDQ0 of the third input I2, as the first through fourth output data FDO[3:0], respectively. In this case, the first internal data iDQ0 may be specified as a fail data bit output in a different logic state from those of the second through fourth internal data iDQ1 through iDQ3.

When the first and second select signal bits [S1:S2] are "11", the first selector 510 may output the first through fourth internal data iDQ0 through iDQ3, including the second internal data iDQ1 of the fourth input I3, as the first through fourth output data FDO[3:0], respectively. In this case, the second internal data iDQ1 may be specified as a fail data bit output in a different logic state from those of the first, third, and fourth internal data iDQ0, iDQ2, and iDQ3.

In other words, when at least one data bit among the first through fourth internal data iDQ0 through iDQ3 output by a corresponding one of the first through fourth regions A through D is output in a logic state that is different from another data bit among the first through fourth internal data iDQ0 through iDQ3, the test controller (e.g., 340 of FIG. 3) may specify the at least one data bit as the fail data bit.

For example, referring to FIGS. 1, 3, and 5A, in an operating method of memory system (e.g., 30) including a memory device (e.g., 210) and a memory controller (e.g., 110), the memory device may divide the plurality of memory cells of the memory cell array 310 into multiple regions (e.g., A, B, C, and D). The memory device may perform the PBT for the multiple regions. The memory device may select fail data including a fail data bit among the internal data iDQ0 through iDQ3 output from the multiple regions during the PBT. The memory device may output the fail data including the fail data bit to the memory controller via a data input/output signal line (e.g., 122). The memory controller may correct the fail data bit of the fail data using the ECC engine 112.

Additionally, the ECC engine 112 may generate an ECC codeword for correcting the fail data bit of the fail data. The memory controller may transmit the ECC codeword to the memory device. The memory device may write the ECC codeword to memory cells of the memory cell array 310 including a fail memory cell including the fail data bit. This operation will be described in more detail below.

Before the PBT mode, the same data may be set to be written to a plurality of memory cells of the memory cell array 310, and it is assumed that, for example, a data bit '1' has been written. In the PBT mode, any one of the first through fourth internal data iDQ0 through iDQ3 read from the memory cell array 310 may be output as a data bit '0', e.g., a fail data bit '0'. The PBT circuit 342b may select the first through fourth internal data iDQ0 through iDQ3 including the fail data bit '0', and generate the selected data as the first through fourth output data FDO[3:0], respectively. Hereinafter, an operation in which the PBT circuit 342b outputs fail data including a fail data bit will be described with reference to the table of FIG. 5B.

Referring to FIG. 5B, it is assumed that the first internal data iDQ0 among the first through fourth internal data iDQ0 through iDQ3 output from the memory cell array 310 has a fail data bit '0'. The first select signal generator 520 may output the first and second select signal bits [S1:S2] as '10', and the first selector 510 may select and output respectively, as the first through fourth output data FDO[3:0], the first through fourth internal data iDQ0 through iDQ3 including a bit '0' of the first internal data iDQ0 of the third input I2 in response to the first and second select signal bits [S1:S2] '10'. The first through fourth output data FDO[3:0] may be output as bits of '1110', respectively. The first through fourth output data FDO[3:0] may be output as the first through fourth data DQ0 through DQ3, respectively, and may be provided to the memory controller (110 in FIG. 2).

For example, it is assumed that the second internal data iDQ1 among the first through fourth internal data iDQ0 through iDQ3 output from the memory cell array 310 has the fail data bit '0'. The first select signal generator 520 may output the first and second select signal bits [S1:S2] as '11', and the first selector 510 may select and output respectively, as the first through fourth output data FDO[3:0], the first through fourth internal data iDQ0 through iDQ3 including a bit of '0' of the second internal data iDQ1 of the fourth input I3 in response to the first and second select signal bits [S1:S2] '11'. The first through fourth output data FDO[3:0] may be output as bits of '1101', respectively, and may be provided as the first through fourth data DQ0 through DQ3 to the memory controller 110, respectively.

As another example, it is assumed that the third internal data iDQ2 among the first through fourth internal data iDQ0 through iDQ3 output from the memory cell array 310 has the fail data bit '0'. The first select signal generator 520 may output the first and second select signal bits [S1:S2] as '01', and the first selector 510 may select and output respectively, as the first through fourth output data FDO[3:0], the first through fourth internal data iDQ0 through iDQ3 including a bit '0' of the third internal data iDQ2 of the second input I1 in response to the first and second select signal bits [S1:S2] '10'. The first through fourth output data FDO[3:0] may be output as bits of '1011', respectively, and may be provided as the first through fourth data DQ0 through DQ3 to the memory controller 110, respectively.

As another example, it is assumed that the fourth internal data iDQ3 among the first through fourth internal data iDQ0 through iDQ3 output from the memory cell array 310 has the fail data bit '0'. The first select signal generator 520 may output the first and second select signal bits [S1:S2] as '00', and the first selector 510 may select and output respectively, as the first through fourth output data FDO[3:0], the first through fourth internal data iDQ0 through iDQ3 including a bit '0' of the fourth internal data iDQ3 of the first input I0 in response to the first and second select signal bits [S1:S2] '00'. The first through fourth output data FDO[3:0] may be output as bits of '0111', respectively, and may be provided as the first through fourth data DQ0 through DQ3 to the memory controller 110, respectively.

The PBT circuit 342b may select and output fail data including a fail data bit among the first through fourth internal data iDQ0 through iDQ3 read from the memory cell array 310 based on the levels of the first and second select signal bits [S1:S2]. In the present embodiment, in the description of the operation of the PBT circuit 342b, a normal data '1' and a fail data '0' read from the memory cell array 310 are described. Conversely, the PBT circuit 342b may select and output the fail data with respect to the normal data as '0' and the fail data as '1'.

Figure 6A:
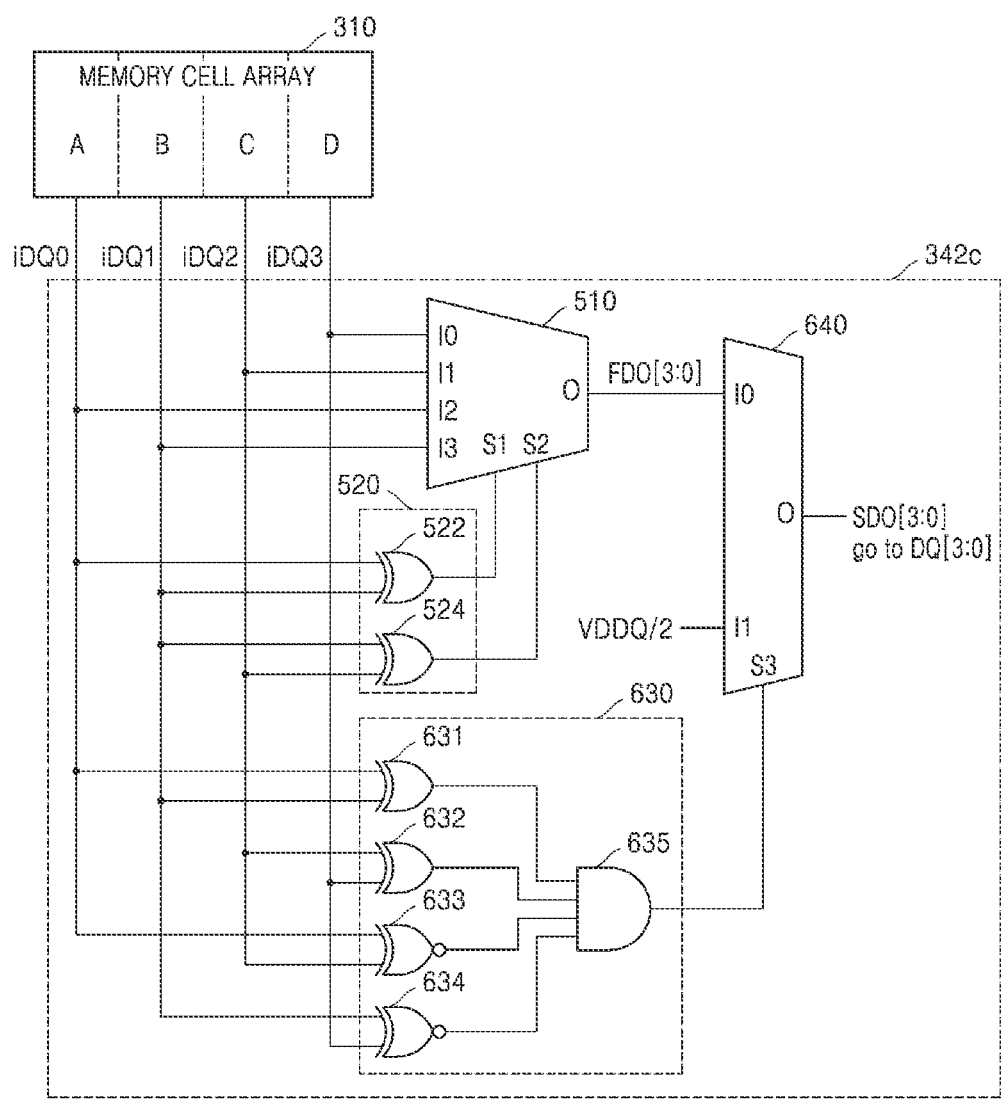
Figure 6B:
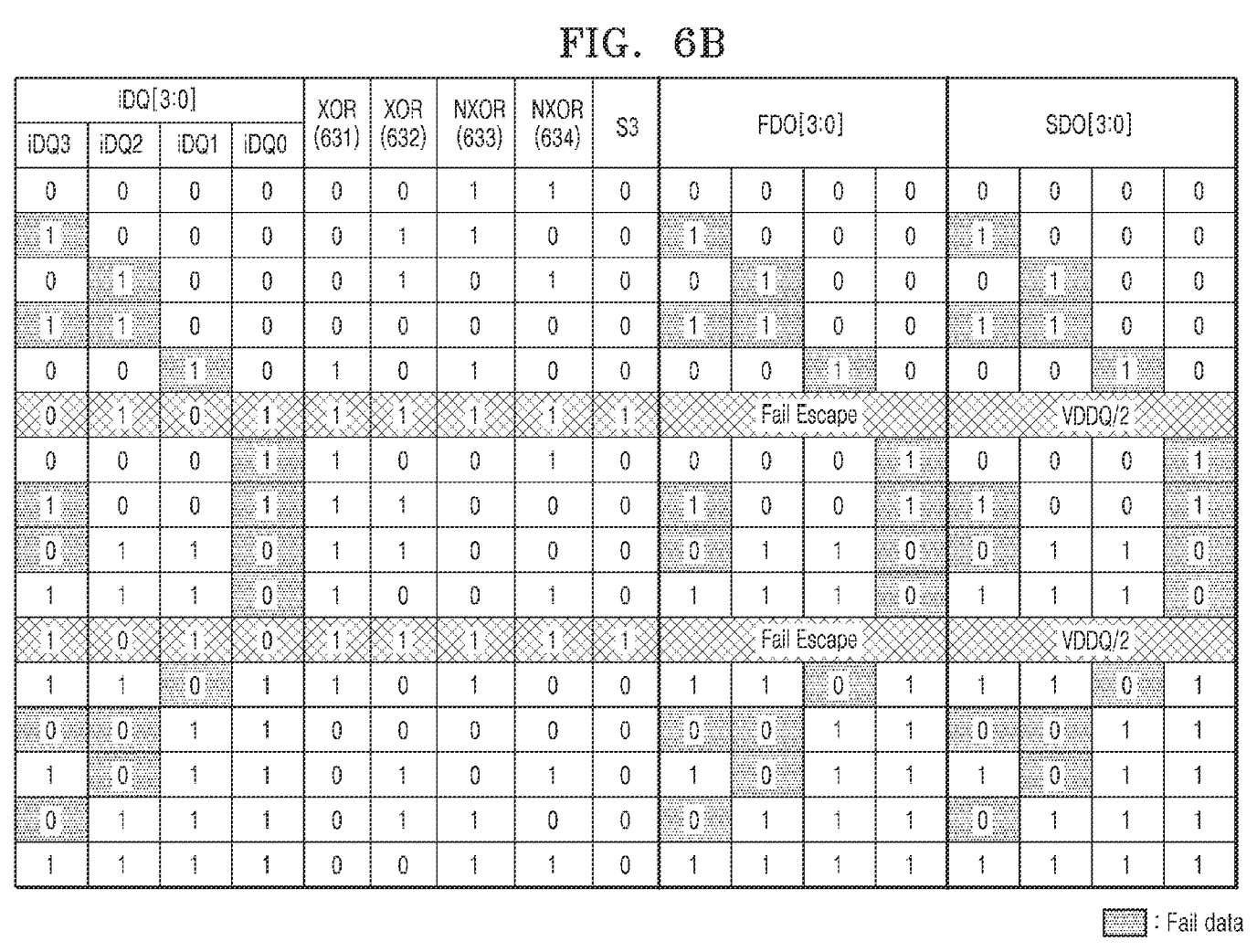

FIGS. 6A and 6B are a diagram and a table, respectively, describing a PBT circuit, according to an embodiment of the inventive concept. FIG. 6A illustrates a diagram of a PBT circuit 342c, and FIG. 6B illustrates a table describing an operation of the PBT circuit 342c. The PBT circuit 342c in FIG. 6A is different from the PBT circuit 342b in FIG. 5A in that the PBT circuit 342c further includes a second select signal generator 630 for outputting a third select signal S3 and a second selector 640 for receiving the third select signal S3. In an embodiment of the inventive concept, the second select signal generator 630 and the second selector 640 may be circuits. Hereinafter, descriptions are given in detail focusing on differences from FIG. 5A.

Referring to FIG. 6A, the PBT circuit 342c may also specify and output a fail data bit of multi-bits (for example, 2 bits) among the first through fourth internal data iDQ0 through iDQ3 read from the memory cell array 310. The PBT circuit 342c may include the first selector 510 outputting first output data FDO[3:0] including fail data among the first through fourth internal data iDQ0 through iDQ3 read from the memory cell array 310 in response to the first and second select signals S1 and S2, and the first select signal generator 520 generating the first and second select signals S1 and S2.

The PBT circuit 342c may further include the second select signal generator 630 and the second selector 640. The second select signal generator 630 may include a third XOR logic circuit 631, a fourth XOR logic circuit 632, a first XNOR logic circuit 633, a second XNOR logic circuit 634, and an AND logic circuit 635.

The third XOR logic circuit 631 may include a first input for receiving the first internal data iDQ0, a second input for receiving the second internal data iDQ1, and an output. The fourth XOR logic circuit 632 may include a first input for receiving the third internal data iDQ2, a second input for receiving the fourth internal data iDQ3, and an output. The first XNOR logic circuit 633 may include a first input for receiving the first internal data iDQ0, a second input for receiving the third internal data iDQ2, and an output. The second XNOR logic circuit 634 may include a first input for receiving the second internal data iDQ1, a second input for receiving the fourth internal data iDQ3, and an output. The AND logic circuit 635 may include a first input for receiving an output of the third XOR logic circuit 631, a second input for receiving an output of the fourth XOR logic circuit 632, a third input for receiving an output of the first XNOR logic circuit 633, a fourth input for receiving an output of the second XNOR logic circuit 634, and an output for outputting the third select signal S3.

The second selector 640 may be implemented with a multiplexer including a first input I0 to which a first output data FDO[3:0] line of the first selector 510 is connected to transmit the first output data FDO[3:0], a second input I1 to which a first voltage VDDQ/2 line is connected to transmit the first voltage VDDQ/2, a third select signal S3 input to which a third select signal line is connected to transmit the third select signal S3, and an output O for outputting second output data SDO[3:0]. The second selector 640 may output first output data FDO[3:0] of the first input I0 as the second output data SDO[3:0] in response to a bit '0' of the third select signal S3. The second selector 640 may output a first voltage VDDQ/2 level of the second input I1 as the second output data SDO[3:0] in response to a bit '1' of the third select signal S3. The first voltage VDDQ/2 level may be set to a voltage level that does not correspond to either data '1' having a power voltage VDDQ level (e.g., a first logic state of the internal data iDQ0 through iDQ3) or data '0' having a ground voltage VSS level (e.g., a second logic state opposite to the first logic state). A first voltage VDDQ/2 may include, for example, a voltage level corresponding to half of the power voltage VDDQ (e.g., an intermediate level). The second output data SDO[3:0] may be output as the first through fourth data DQ (DQ0 through DQ3 in FIG. 3), respectively, and may be provided to the memory controller (110 in FIG. 2). When the received first through fourth data DQ (DQ0 through DQ3 in FIG. 3) are at the first voltage VDDQ/2 level, because they are neither data '1' nor data '0', the memory controller 110 may recognize them as the fail data.

The PBT circuit 342c may output two types of second output data SDO[3:0] after the PBT on the memory cell array 310. First, when a fail data bit is specified among the first through fourth internal data iDQ0 through iDQ3, the PBT circuit 342c may select and output, as the second output data SDO[3:0], the fail data including the fail data bit. Second, when the fail data bit is not specified among the first through fourth internal data iDQ[3:0], and accordingly, the fail data is not output, the PBT circuit 342c may output the first voltage VDDQ/2 level as the second output data SDO [3:0]. Hereinafter, the operation of the PBT circuit 342c will be described with reference to the table of FIG. 6B.

Referring to FIG. 6B, when the first through fourth internal data iDQ[3:0] read from the memory cell array 310 are '0000' bits, the PBT circuit 342c may output '0000' bits of the first output data FDO[3:0] of the first selector 510 as '0000' bits of the second output data SDO[3:0] in response to the bit '0' of the third select signal S3. When the first through fourth internal data iDQ0 through iDQ3 are equally output as '0000' bits, the first output data FDO[3:0] will also be output as '0000' bits. Hereinafter, it is assumed that the same data, for example, a normal data '0', is written in the plurality of memory cells of the memory cell array 310 before the PBT mode.

When the first through fourth internal data iDQ[3:0] read from the memory cell array 310 are '1000' bits, the PBT circuit 342c may output '1000' bits of the first output data FDO[3:0] of the first selector 510 as '1000' bits of the second output data SDO[3:0] in response to the bit '0' of the third select signal S3. The first selector 510 may specify a fail data bit '1' of the fourth internal data iDQ3 of the first input I0 in response to '00' of the first and second select signal bits [S1:S2], and select and output, as '1000' bits of the first through fourth data FDO[3:0], the first through fourth internal data iDQ0 through iDQ3 including the fourth internal data iDQ3.

When the first through fourth internal data iDQ[3:0] read from the memory cell array 310 are '0100' bits, the PBT circuit 342c may output '0100' bits of the first output data FDO[3:0] of the first selector 510 as '0100' bits of the second output data SDO[3:0] in response to the bit '0' of the third select signal S3. The first selector 510 may specify a fail data bit '1' of the third internal data iDQ2 of the second input I1 in response to '01' of the first and second select signal bits [S1:S2)], and select and output, as '0100' bits of the first through fourth data FDO[3:0], the first through fourth internal data iDQ0 through iDQ3 including the third internal data iDQ2.

When the first through fourth internal data iDQ[3:0] read from the memory cell array 310 are '1100' bits, the PBT circuit 342c may output '1100' bits of the first output data FDO[3:0] of the first selector 510 as '1100' bits of the second output data SDO[3:0] in response to the bit '0' of the third select signal S3. The first selector 510 may specify a fail data bit '1' of the third internal data iDQ2 of the second input I1 in response to '01' of the first and second select signal bits [S1:S2)], and select and output, as '1100' bits of the first through fourth data FDO[3:0], the first through fourth internal data iDQ0 through iDQ3 including the third internal data iDQ2.

When the first through fourth internal data iDQ[3:0] read from the memory cell array 310 are '0010' bits, the PBT circuit 342c may output '0010' bits of the first output data FDO[3:0] of the first selector 510 as '0010' bits of the second output data SDO[3:0] in response to the bit '0' of the third select signal S3. The first selector 510 may specify a fail data bit '1' of the second internal data iDQ1 of the fourth input I3 in response to '11' of the first and second select signal bits [S1:S2], and select and output, as '0010' bits of the first through fourth data FDO[3:0], the first through fourth internal data iDQ0 through iDQ3 including the second internal data iDQ1.

When the first through fourth internal data iDQ[3:0] read from the memory cell array 310 are '0101' bits, the PBT circuit 342c may output the first voltage VDDQ/2 level as the second output data SDO[3:0] in response to the bit '1' of the third select signal S3. When the first and third internal data iDQ0 and iDQ2 are the same as a fail data bit '1' among the first through fourth internal data iDQ0 through iDQ3, the first selector 510 may specify the fail data bit of the second internal data iDQ1 of the fourth input I3 in response to '11' of the first and second select signal bits [S1:S2], and in this case, the bit of the second internal data iDQ1 may not be a fail data bit. In other words, '0101' bits of the first through fourth internal data (iDQ[3:0]) may be failure escapes that are not identified as fails. Accordingly, the PBT circuit 342c may output the second output data SDO[3:0] having the first voltage VDDQ/2 level.

When the first through fourth internal data iDQ[3:0] read from the memory cell array 310 are '0001' bits, the PBT circuit 342c may output '0001' bits of the first output data FDO[3:0] of the first selector 510 as '0001' bits of the second output data SDO[3:0] in response to the bit '0' of the third select signal S3. The first selector 510 may specify a fail data bit '1' of the first internal data iDQ0 of the third input I2 in response to '10' of the first and second select signal bits [S1:S2)], and select and output, as '0001' bits of the first through fourth data FDO[3:0], the first through fourth internal data iDQ0 through iDQ3 including the first internal data iDQ0.

When the first through fourth internal data iDQ[3:0] read from the memory cell array 310 are '1001' bits, the PBT circuit 342c may output '1001' bits of the first output data FDO[3:0] of the first selector 510 as '1001' bits of the second output data SDO[3:0] in response to the bit '0' of the third select signal S3. The first selector 510 may specify a fail data bit '1' of the first internal data iDQ0 of the third input I2 in response to '10' of the first and second select signal bits [S1:S2)], and select and output, as '1001' bits of the first through fourth data FDO[3:0], the first through fourth internal data iDQ0 through iDQ3 including the first internal data iDQ0.

Hereinafter, it is assumed that the same data, for example, data '1' is written in the plurality of memory cells of the memory cell array 310 before the PBT mode.

When the first through fourth internal data iDQ[3:0] read from the memory cell array 310 are '0110' bits, the PBT circuit 342c may output '0110' bits of the first output data FDO[3:0] of the first selector 510 as '0110' bits of the second output data SDO[3:0] in response to the bit '0' of the third select signal S3. The first selector 510 may specify a fail data bit '0' of the first internal data iDQ0 of the third input I2 in response to '10' of the first and second select signal bits [S1:S2)], and select and output, as '0110' bits of the first through fourth data FDO[3:0], the first through fourth internal data iDQ0 through iDQ3 including the first internal data iDQ0.

When the first through fourth internal data iDQ[3:0] read from the memory cell array 310 are '1110' bits, the PBT circuit 342c may output '1110' bits of the first output data FDO[3:0] of the first selector 510 as '1110' bits of the second output data SDO[3:0] in response to the bit '0' of the third select signal S3. The first selector 510 may specify a fail data bit '0' of the first internal data iDQ0 of the third input I2 in response to '10' of the first and second select signal bits [S1:S2)], and select and output, as '1110' bits of the first through fourth data FDO[3:0], the first through fourth internal data iDQ0 through iDQ3 including the first internal data iDQ0.

When the first through fourth internal data iDQ[3:0] read from the memory cell array 310 are '1010' bits, the PBT circuit 342c may output the first voltage VDDQ/2 level as the second output data SDO[3:0] in response to the bit '1' of the third select signal S3. Among the first through fourth internal data iDQ0 through iDQ3, the first and third internal data iDQ0 and iDQ2 may both be the fail data bit "0". The first selector 510 may specify a fail data bit of the second internal data iDQ1 of the fourth input I3 in response to "11" of the first and second select signal bits [S1:S2], and in this case, the bit of the second internal data iDQ1 may not be a fail data bit. In other words, '1010' bits of the first through fourth internal data (iDQ[3:0]) may be failure escapes that are not identified as fails. Accordingly, the PBT circuit 342c may output the second output data SDO[3:0] having the first voltage VDDQ/2 level.

When the first through fourth internal data iDQ[3:0] read from the memory cell array 310 are '1101' bits, the PBT circuit 342c may output '1101' bits of the first output data FDO[3:0] of the first selector 510 as '1101' bits of the second output data SDO[3:0] in response to the bit '0' of the third select signal S3. The first selector 510 may specify a fail data bit '0' of the second internal data iDQ1 of the fourth input I3 in response to '11' of the first and second select signal bits [S1:S2], and select and output, as '1101' bits of the first through fourth data FDO[3:0], the first through fourth internal data iDQ0 through iDQ3 including the second internal data iDQ1.

When the first through fourth internal data iDQ[3:0] read from the memory cell array 310 are '0011' bits, the PBT circuit 342c may output '0011' bits of the first output data FDO[3:0] of the first selector 510 as '0011' bits of the second output data SDO[3:0] in response to the bit '0' of the third select signal S3. The first selector 510 may specify a fail data bit '0' of the third internal data iDQ2 of the second input I1 in response to '01' of the first and second select signal bits [S1:S2], and select and output, as '0011' bits of the first through fourth data FDO[3:0], the first through fourth internal data iDQ0 through iDQ3 including the third internal data iDQ2.

When the first through fourth internal data iDQ[3:0] read from the memory cell array 310 are '1011' bits, the PBT circuit 342c may output '1011' bits of the first output data FDO[3:0] of the first selector 510 as '1011' bits of the second output data SDO[3:0] in response to the bit '0' of the third select signal S3. The first selector 510 may specify a fail data bit '0' of the third internal data iDQ2 of the second input I1 in response to '01' of the first and second select signal bits [S1:S2], and select and output, as '1011' bits of the first through fourth data FDO[3:0], the first through fourth internal data iDQ0 through iDQ3 including the third internal data iDQ2.

When the first through fourth internal data iDQ[3:0] read from the memory cell array 310 are '0111' bits, the PBT circuit 342c may output '0111' bits of the first output data FDO[3:0] of the first selector 510 as '0111' bits of the second output data SDO[3:0] in response to the bit '0' of the third select signal S3. The first selector 510 may specify a fail data bit '0' of the fourth internal data iDQ3 of the first input I0 in response to '00' of the first and second select signal bits [S1:S2], and select and output, as '0111' bits of the first through fourth data FDO[3:0], the first through fourth internal data iDQ0 through iDQ3 including the fourth internal data iDQ3.

When the first through fourth internal data iDQ[3:0] read from the memory cell array 310 are '1111' bits, the PBT circuit 342c may output '1111' bits of the first output data FDO[3:0] of the first selector 510 as '1111' bits of the second output data SDO[3:0] in response to the bit '0' of the third select signal S3. When the first through fourth internal data iDQ0 through iDQ3 are equally output as '1111' bits, the first output data FDO[3:0] will also be output as '1111' bits.

Figure 7:
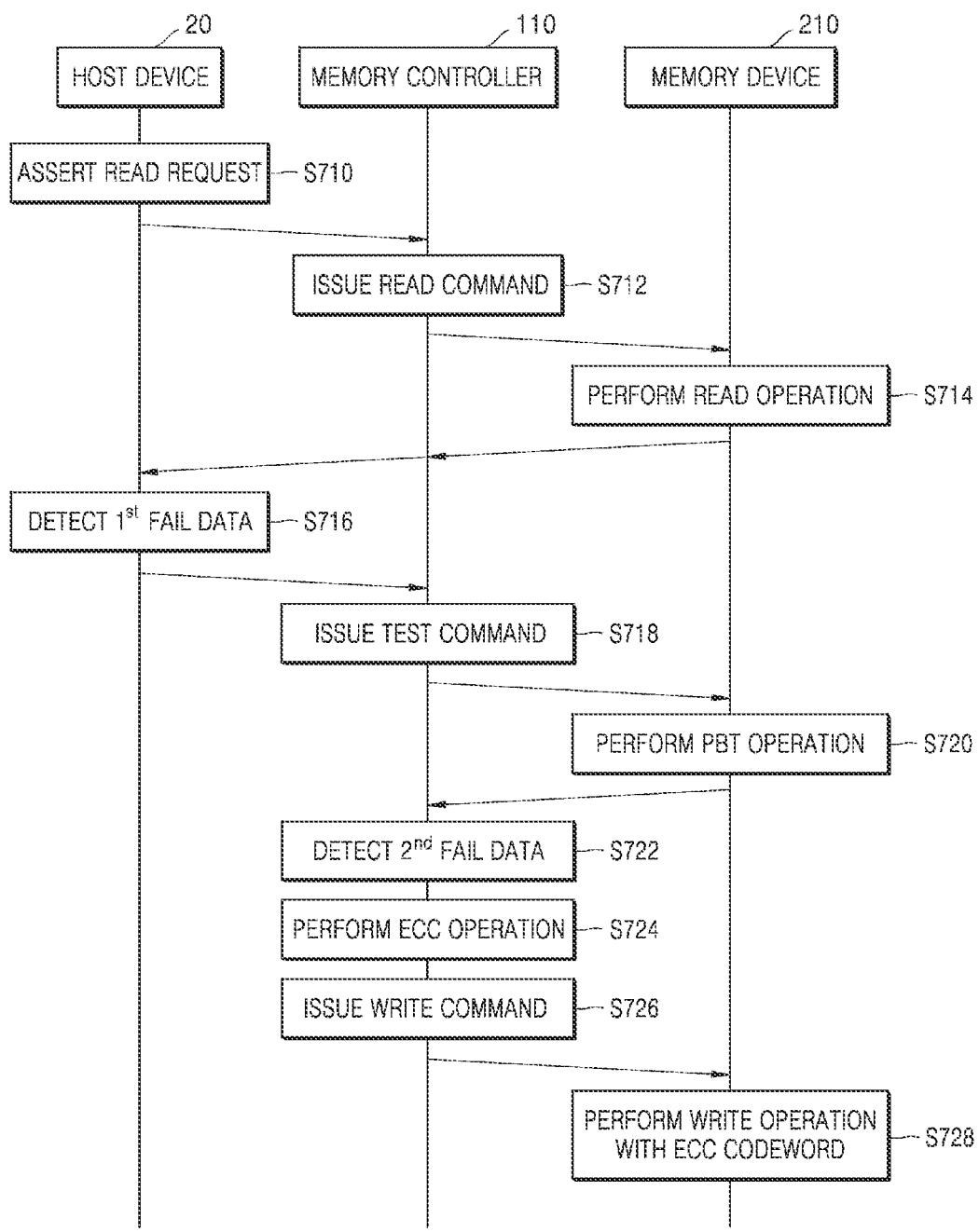
FIG. 7 is a flowchart of an operating method of the system of FIG. 1 according to an embodiment of the inventive concept.

FIG. 7 is a flowchart of an operating method of the system of FIG. 1 according to an embodiment of the inventive concept. In FIG. 7, operations of the host device 20, the memory controller 110, and the memory device 210 in the system 10 of FIG. 1 are described.

Referring to FIGS. 1 and 7, the host device 20 may assert a read request (S710). The host device 20 may transmit a read request to the memory controller 110 to load data to be used for the operation of the processor 21.

The memory controller 110 may issue a read command, according to the received read request, to the memory device 210 (S712). The memory controller 110 may transmit the clock signal CLK and the command/address signal C/A associated with the read command to the memory device 210 via the memory interface 120.

The memory device 210 may perform a read operation in response to the received read command (S714). Data read from the memory device 210 may be transmitted to the host device 20 via the memory controller 110. As described in FIG. 2, x4 data bits read from each of the memory devices 210 of the memory module 220 may be output via the data bus 122, and may be transmitted to the host device 20.

The processor 21 of the host device 20 may receive data according to the read request, and detect that the received data includes the first fail data (S716). The host device 20 may transmit to the memory controller 110 first fail information (e.g., a fail address) indicating that the data read from the memory device 210 of the memory module 220 includes the first fail data.

The memory controller 110 may issue a test command to each of the memory devices 210 of the memory module 220 to detect a fail memory cell having a fail data (S718). The memory controller 110 may transmit the test command to each of the memory devices 210 to perform a memory full cell test on the memory cell array 310 of the memory device 210.

The memory device 210 may perform the PBT operation on the memory cell array 310 in response to the received test command (S720). The PBT operation on the memory cell array 310 may be the same as or similar to the operation of the PBT circuits 342b and 342c described with reference to FIGS. 5A through 6B. The memory device 210 may perform the PBT operation, specify a fail data bit among the first through fourth internal data iDQ[3:0] read from the memory cell array 310, and output a fail data including the fail data bit to the data bus 122. When the memory device 210 performs the PBT operation but cannot output the fail data because the fail data bit is not specified among the first through fourth internal data iDQ[3:0], the memory device 210 may output the first voltage VDDQ/2 level to the data bus 122. The fail data or the first voltage VDDQ/2 level loaded on the data bus 122 may be transmitted to the memory controller 110.

The memory controller 110 may receive data including the fail data bit from the memory device 210, and determine that the received data includes a second fail data (S722). The memory controller 110 may receive second fail information (e.g., a fail address) about the second fail data together with the second fail data, and when it is determined that the first fail information and the second fail information received from the host device 20 are the same, may then move to operations S724, S726 and S728.

The memory controller 110 may generate the ECC codeword for the second fail data including the fail data bit by performing an ECC operation using the ECC engine 112 (S724). The memory controller 110 may issue a write command for writing the ECC codeword for the second fail data into fail memory cells corresponding to the second fail information of the memory device 210 (S726). The memory device 210 may receive the ECC codeword together with the write command, and write the ECC codeword in memory cells corresponding to the second fail information of the memory device 210 (S728). The purpose of this operation may be to prevent generation of fail data bits as the memory cells including fail memory cells are filled with the ECC codeword.

Figure 8:
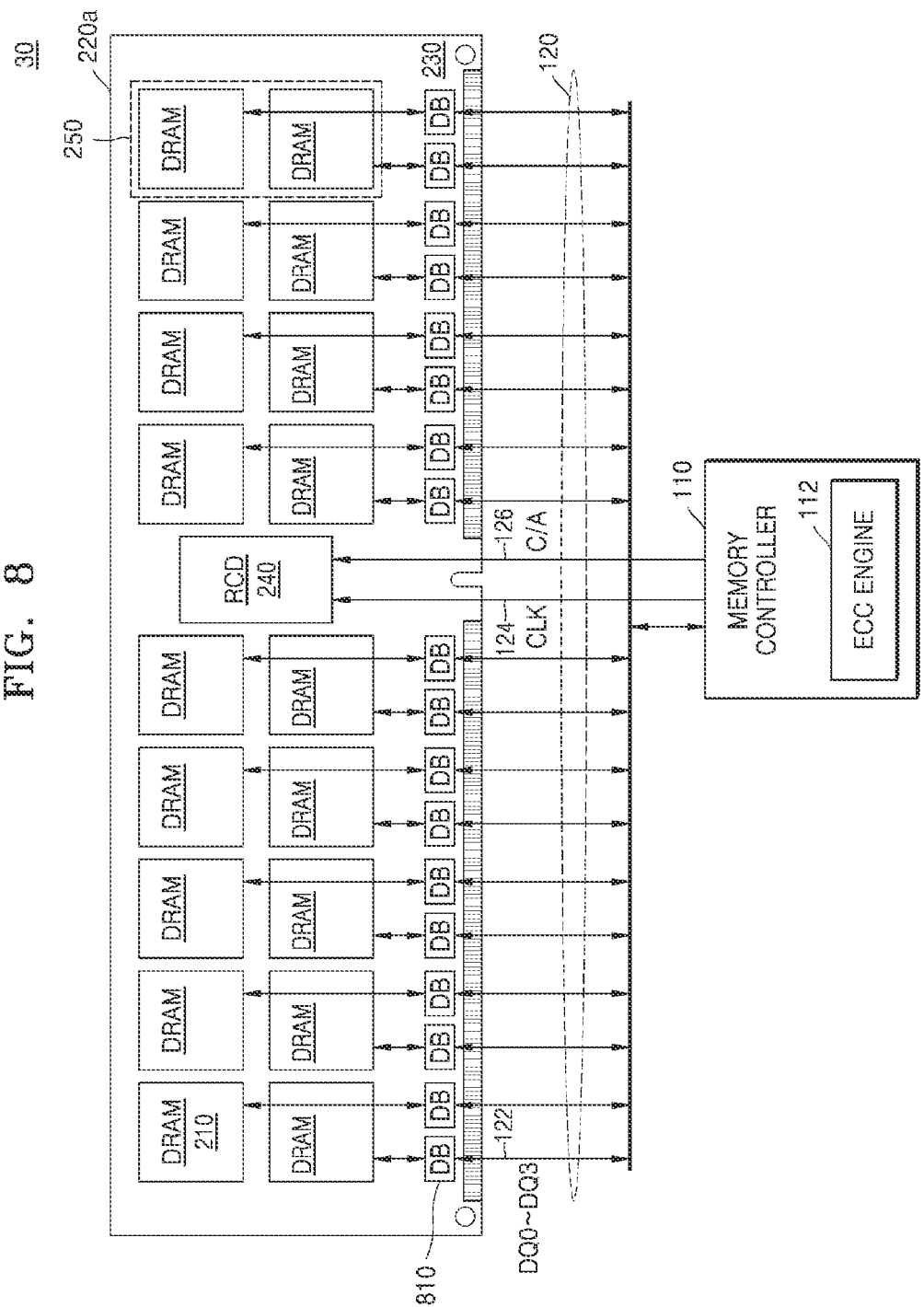
FIG. 8 is a block diagram of a memory module on which a memory device is mounted, according to an embodiment of the inventive concept.

FIG. 8 is a block diagram of a memory module on which a memory device is mounted, according to an embodiment of the inventive concept.

Referring to FIG. 8, a memory module 220a may be implemented as LRDIMM. The memory module 220a in FIG. 8 is different from the memory module 220 of FIG. 2 in that it further includes a data buffer 810 connected to each of the memory devices 210 in a one-to-one correspondence. Duplicate descriptions of the LRDIMM 220a with respect to the RDIMM 220 in FIG. 2 are omitted.

Bidirectional data buses 122 via which the data DQ is transmitted may be coupled to the data buffers 810, respectively. On-die termination (ODT) may be provided to each of the data buffers 810 connected to the data buses 122. When the data DQ is bi-directionally transmitted to the data buses 122, a data strobe signal DQS may also be transmitted.

The memory device 210 may be the same as or similar to the memory device 210 described with reference to FIGS. 1 through 7. The memory device 210 may divide the memory cell array 310 including a plurality of memory cells into a plurality of regions, and may include PBT circuits 342b and 342c that perform the PBT on the plurality of memory cells. The PBT circuits 342b and 342c may specify a fail data bit among data output from the multiple regions of the PBT, and provide a fail data including the fail data bit to the memory controller 110. The memory controller 110 may include the ECC engine 112 that corrects and detects an error in data read from the memory devices 210, and may correct the specified fail data bit by using the ECC engine 112. The ECC engine 112 may generate the ECC codeword for correcting the fail data bit. The memory controller 110 may control the memory device 210 so that the ECC codeword is written to the memory cells including fail memory cells having the fail data bit.

Figure 9:
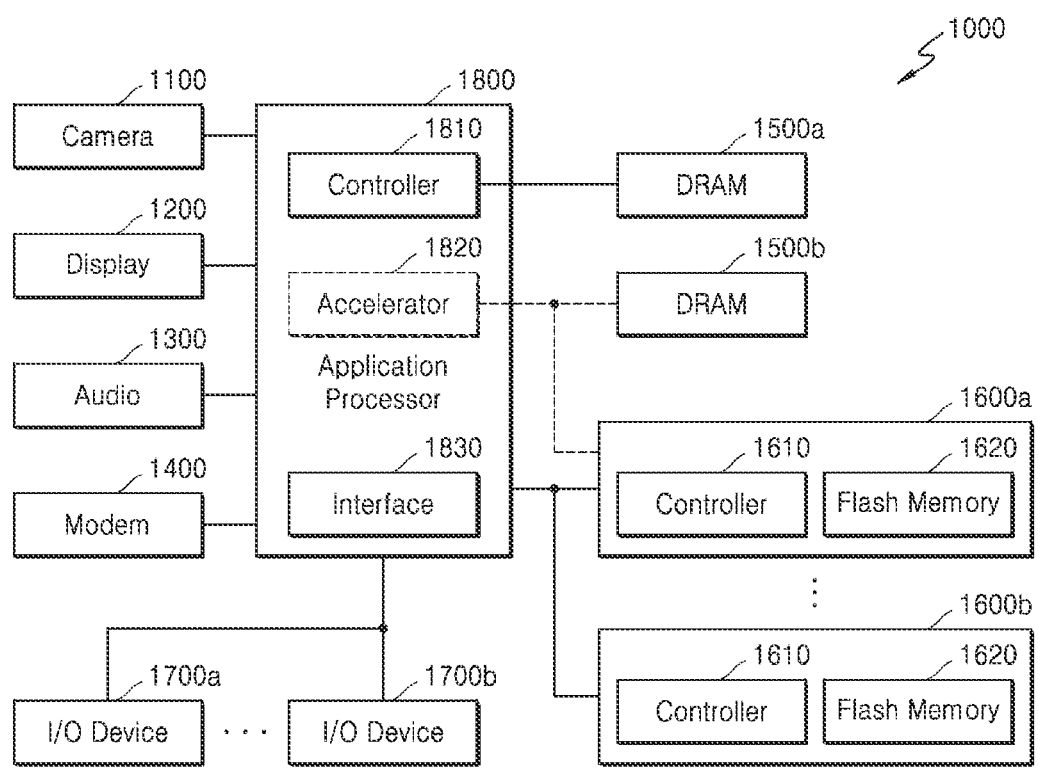
FIG. 9 is a block diagram of a system to which a memory device is applied, according to an embodiment of the inventive concept.

FIG. 9 is a block diagram of a system to which a memory device is applied, according to an embodiment of the inventive concept.

Referring to FIG. 9, a system 1000 may include a camera 1100, a display 1200, an audio processing unit 1300, a modem 1400, DRAMs 1500a and 1500b, flash memories 1600a and 1600b, I/O devices 1700a and 1700b, and an application processor (hereinafter, referred to as 'AP') 1800. The system 1000 may be implemented as a laptop computer, a mobile phone, a smartphone, a tablet personal computer (PC), a wearable device, a health care device, or an Internet-of-Things (IoT) device. In addition, the system 1000 may be implemented as a server or a PC.

The camera 1100 may capture a still image or a moving image according to a user's control, and may store or transmit to the display 1200 the captured image/image data. The audio processing unit 1300 may process audio data included in the flash memories 1600a and 1600b or in the content of a network. The modem 1400 may modulate and transmit a signal for transceiving wired/wireless data, and demodulate the modulated signal to restore an original signal at a receiving side. The I/O devices 1700a and 1700b may include devices providing digital inputs and/or output functions such as a universal serial bus (USB) storage, a digital camera, a secure digital (SD) card, a digital versatile disc (DVD), a network adapter, or a touch screen.

The AP 1800 may control all operations of the system 1000 via a controller 1810 and communicate with other elements of the system 1000 via an interface 1830. The AP 1800 may control the display 1200 so that a portion of the content stored in the flash memories 1600a and 1600b is displayed on the display 1200. When a user input is received via the I/O devices 1700a and 1700b, the AP 1800 may perform a control operation corresponding to the user input. The AP 1800 may include an accelerator block, which is a dedicated circuit for artificial intelligence (AI) data computation, or may include an accelerator chip 1820 that is separated from the AP 1800. The DRAM 1500b may be additionally mounted on the accelerator block or the accelerator chip 1820. An accelerator may be a function block that specializes in performing a particular function of the AP 1800, and may include a graphics processing unit (GPU) that is a function block specialized in processing graphics data, a neural processing unit (NPU) that is a block specialized in AI calculation and inference, or a data processing unit (DPU) that is a block specialized in data transmission.

The system 1000 may include a plurality of DRAMs 1500a and 1500b. The AP 1800 may control the DRAMs 1500a and 1500b by setting a command and a mode register (MRS) in accordance with a Joint Electron Device Engineering Council (JEDEC) standard, or may set a DRAM interface protocol and communicate to use unique functions of an enterprise such as low voltage, high speed, reliability, or the like, and cyclic redundancy check (CRC)/ECC functions. For example, the AP 1800 may communicate with the DRAM 1500a via an interface conforming to JEDEC standards such as LPDDR4 and LPDDR5, and the accelerator block or accelerator chip 1820 may communicate by setting a new DRAM interface protocol for controlling the DRAM 1500b to be used as an accelerator having a higher bandwidth than the DRAM 1500a.

FIG. 9 illustrates only the DRAMs 1500a and 1500b, but the inventive concept is not limited thereto. As long as a bandwidth, a response speed, and a voltage condition of the AP 1800 or the accelerator chip 1820 are satisfied, any memory such as PRAM, SRAM, MRAM, RRAM, FRAM, hybrid RAM, or the like may be used. The DRAMs 1500a and 1500b may have relatively less latency and bandwidth than the I/O devices 1700a and 1700b or the flash memories 1600a and 1600b. The DRAMs 1500a and 1500b may be initialized at a power-on time point of the system 1000, and when an operating system and application data are loaded, may be used as a temporary storage for the operating system and application data, or as an execution space for various software codes.

In the DRAMs 1500a and 1500b, four rules of addition/subtraction/multiplication/division, a vector computation, an address computation, or a fast Fourier transform (FFT) operation may be performed. In addition, in the DRAMs 1500a and 1500b, a function for performing inference may be carried out. In this case, the inference may be performed by using a deep learning algorithm via an artificial neural network. The deep learning algorithm may include a training operation of training a model using various data and the inference operation of recognizing data by using the trained model. In an embodiment of the inventive concept, the image captured by using the camera 1100 by the user may be signal-processed and stored in the DRAM 1500b, and the accelerator block or the accelerator chip 1820 may perform AI data computation that recognizes data by using data stored in the DRAM 1500b and the function used for the inference.

The DRAMs 1500a and 1500b may be the same as or similar to the memory device 210 described with reference to FIGS. 1 through 8. The memory device 210 may divide the memory cell array 310 including a plurality of memory cells into a plurality of regions, and may include PBT circuits 342b and 342c that perform the PBT on the plurality of memory cells. The PBT circuits 342b and 342c may specify a fail data bit from among data output from the plurality of regions of the PBT, and provide fail data including the fail data bit to the memory controller 110. The memory controller 110 may include the ECC engine 112 that corrects and detects an error in data read from the memory devices 210, and may correct the specified fail data bit by using the ECC engine 112. The ECC engine 112 may generate the ECC codeword for correcting the specified fail data bit. The memory controller 110 may control the memory device 210 so that the ECC codeword is written to the memory cells including fail memory cells having the fail data bit.

The system 1000 may include a plurality of storages or a plurality of flash memories 1600a and 1600b having a capacity greater than that of the DRAMs 1500a and 1500b. The accelerator block or the accelerator chip 1820 may perform a training operation and AI data operation by using the flash memories 1600a and 1600b. In an embodiment of the inventive concept, the flash memories 1600a and 1600b may efficiently perform the training operation and the AI data operation by using a computation device provided in a memory controller 1610 included in the flash memories 1600a and 1600b. The flash memories 1600a and 1600b may store a picture taken by using the camera 1100, or may store data transmitted via a data network. For example, the flash memories 1600a and 1600b may store augmented reality (AR)/virtual reality (VR), high definition (HD), or ultra-high definition (UHD) content.

While the inventive concept has been particularly shown and described with reference to embodiments thereof, it will be understood that various changes in form and details may be made thereto without departing from the spirit and scope of inventive concept as set forth by the following claims.

What is claimed is:

1. A memory device comprising:
    a memory cell array comprising a plurality of memory cells, wherein the memory cell array is divided into multiple regions; and
    a test controller configured to perform a parallel bit test (PBT) on the plurality of memory cells, wherein the test controller receives internal data from the multiple regions during the PBT, generates one or more select signals based on the internal data, generates fail data comprising a fail data bit indicating a region from the multiple regions based on the internal data and one or more select signals, and outputs the fail data via a data input/output signal line to the outside of the memory device.

2. The memory device of claim 1, wherein the memory cell array is divided into first through fourth regions, and
    wherein, when at least one data bit among first through fourth internal data output by a corresponding one of the first through fourth regions is output in a logic state that is different from another data bit among the first through fourth internal data, the test controller specifies the at least one data bit as the fail data bit.

3. The memory device of claim 2, wherein the test controller comprises:
    a select signal generator circuit configured to generate a first select signal by performing XOR logic computation on the first internal data and the second internal data, and a second select signal by performing XOR logic computation on the second internal data and the third internal data; and a selector circuit configured to input the first through fourth internal data, and select and output, as an output data, the fail data including the fail data bit among the first through fourth internal data.

4. The memory device of claim 3, wherein the selector circuit is configured with a multiplexer, wherein the multiplexer comprises:
a first input to which a fourth internal data line is connected;
a second input to which a third internal data line is connected;
a third input to which a first internal data line is connected;
a fourth input to which a second internal data line is connected;
a first select signal input to which a first select signal line is connected;
a second select signal input to which a second select signal line is connected; and
an output configured to output the output data, and
wherein the first to fourth internal data lines transmit the first to fourth internal data, respectively, and the first and second select signal lines transmit the first and second select signals, respectively.

5. The memory device of claim 2, wherein the test controller outputs a first voltage level to the outside of the memory device via the data input/output signal line, when the fail data bit is not specified among the first through fourth internal data and the fail data is not output, and the first voltage level is a voltage level that does not correspond to either a first logic state of the first through fourth internal data or a second logic state opposite to the first logic state.

6. The memory device of claim 5, wherein the first voltage level is an intermediate level between a voltage level of the first logic state and a voltage level of the second logic state.

7. The memory device of claim 5, wherein the test controller comprises:

a first select signal generator circuit configured to generate a first select signal by performing XOR logic computation on the first internal data and the second internal data, and a second select signal by performing XOR logic computation on the second internal data and the third internal data;
a first selector circuit configured to input the first through fourth internal data, and select and output, as a first output data, the fail data including the fail data bit among the first through fourth internal data;
a second select signal generator circuit configured to generate a third select signal based on the first through fourth internal data; and
a second selector circuit configured to input the first output data and the first voltage level of the first selector circuit, and select and output, as a second output data, one of the first output data and the first voltage level in response to the third select signal.

8. The memory device of claim 7, wherein the first selector circuit is configured with a first multiplexer, wherein the first multiplexer comprises:
a first input to which a fourth internal data line is connected;
a second input to which a third internal data line is connected;
a third input to which a first internal data line is connected;
a fourth input to which a second internal data line is connected;
a first select signal input to which a first select signal line is connected;
a second select signal input to which a second select signal line is connected; and
an output configured to output the first output data, and
wherein the first to fourth internal data lines transmit the first to fourth internal data, respectively, and the first and second select signal lines transmit the first and second select signals, respectively.

9. The memory device of claim 7, wherein the second select signal generator circuit comprises:

a first XOR logic circuit configured to receive the first internal data and the second internal data;
a second XOR logic circuit configured to receive the third internal data and the fourth internal data;
a first XNOR logic circuit configured to receive the first internal data and the third internal data;
a second XNOR logic circuit configured to receive the second internal data and the fourth internal data; and
an AND logic circuit configured to receive an output of the first XOR logic circuit, an output of the second XOR logic circuit, an output of the first XNOR logic circuit, and an output of the second XNOR logic circuit, and output the third select signal.

10. The memory device of claim 7, wherein the second selector circuit is configured with a second multiplexer, wherein the second multiplexer comprises:
a first input to which a first output data line of the first selector circuit is connected;
a second input to which a first voltage level line is connected;
a third select signal input to which a third select signal line is connected; and
an output configured to output the second output data, and
wherein the first output data line transmits the first output data, the first voltage level line transmits the first voltage level, and the third select signal line transmits the third select signal.

11. A memory system comprising:

a plurality of memory devices coupled to a printed circuit board, and each comprising a memory cell array comprising a plurality of memory cells and a test controller, wherein the memory cell array is divided into multiple regions; and
a memory controller configured to control the plurality of memory devices, and comprising an error correction code (ECC) engine configured to correct and detect an error of data read from the plurality of memory devices,
wherein, in each of the plurality of memory devices, the test controller performs a parallel bit test (PBT) on the multiple regions of the memory cell array, receives internal data from the multiple regions during the PBT, generates one or more select signals based on the internal data, generates fail data comprising a fail data bit indicating a region from the multiple regions based on the internal data and one or more select signals, and outputs the fail data to the memory controller via a data input/output signal line, and
the memory controller corrects the fail data bit of the fail data by using the ECC engine.

12. The memory system of claim 11, wherein the ECC engine generates an ECC codeword for correcting the fail data bit, and the ECC codeword is written to memory cells comprising a fail memory cell comprising the fail data bit.

13. The memory system of claim 12, wherein the test controller outputs a first voltage level to the memory controller via the data input/output signal line, when the fail data bit is not specified among the first through fourth internal data and the fail data is not output, and the first voltage level is a voltage level that does not correspond to either a first logic state of the first through fourth internal data or a second logic state opposite to the first logic state.

14. The memory system of claim 13, wherein the first voltage level is an intermediate level between a voltage level of the first logic state and a voltage level of the second logic state.

15. The memory system of claim 11, wherein the memory cell array is divided into first through fourth regions, and wherein, when at least one data bit among first through fourth internal data output by a corresponding one of the first through fourth regions is output in a logic state that is different from another data bit among the first through fourth internal data, the test controller specifies the at least one data bit as the fail data bit.

16. The memory system of claim 11, wherein the plurality of memory devices coupled to the printed circuit board comprise a memory module, and the memory module is implemented with any one of an un-buffered dual in-line memory module (DIMM) (UDIMM), a registered DIMM (RDIMM), a load reduced DIMM (LRDIMM), a fully buffered DIMM (FBDIMM), or a small outline DIMM (SODIMM).

17. An operating method of a memory system comprising a memory device and a memory controller, wherein the memory device includes a memory cell array and the memory controller includes an error correction code (ECC) engine configured to correct and detect an error of data read from the memory device, the operating method comprising:

dividing, in the memory device, a plurality of memory cells of the memory cell array into multiple regions;

performing, in the memory device, a parallel bit test (PBT) for the multiple regions;

receiving internal data from the multiple regions during the PBT;

generating one or more select signals based on the internal data;

generating, in the memory device, fail data comprising a fail data bit indicating a region from the multiple regions based on the internal data and one or more select signals;

outputting, by the memory device, the fail data comprising the fail data bit to the memory controller via a data input/output signal line; and correcting, in the memory controller, the fail data bit of the fail data by using the ECC engine.

18. The operating method of claim 17, further comprising:

generating, in the ECC engine, an ECC codeword for correcting the fail data bit of the fail data;

transmitting, by the memory controller, the ECC codeword to the memory device; and writing, in the memory device, the ECC codeword to memory cells comprising a fail memory cell comprising the fail data bit.

19. The operating method of claim 17, wherein the selecting of the fail data comprising the fail data bit among the internal data output from the multiple regions during the PBT comprises specifying at least one data bit as the fail data bit when the at least one data bit among the internal data output from the multiple regions is output in a logic state that is different from another data bit among the internal data.

20. The operating method of claim 19, further comprising loading a first voltage level on the data input/output signal line and outputting the loaded first voltage level to the memory controller when the fail data bit is not specified among the internal data and the fail data is not output, wherein the first voltage level is a voltage level that does not correspond to a first logic state of the internal data output from the multiple regions or a second logic state opposite to the first logic state.

* * * * *